(12) United States Patent
Lee et al.

(10) Patent No.: US 10,818,360 B2
(45) Date of Patent: Oct. 27, 2020

(54) MEMORY DEVICE, MEMORY SYSTEM INCLUDING THE MEMORY DEVICE

(71) Applicant: SK hynix Inc., Icheon-si Gyeonggi-do (KR)

(72) Inventors: Jong Hoon Lee, Suwon-si (KR); Ji Hwan Kim, Seoul (KR); Kwang Ho Baek, Icheon-si (KR); Jin Haeng Lee, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/445,932

(22) Filed: Jun. 19, 2019

(65) Prior Publication Data

US 2020/0143886 A1     May 7, 2020

(30) Foreign Application Priority Data

Nov. 2, 2018    (KR) .................... 10-2018-0133661

(51) Int. Cl.

| | | |
|---|---|---|
| *G11C 16/10* | (2006.01) | |
| *G11C 16/30* | (2006.01) | |
| *G11C 16/34* | (2006.01) | |
| *G06F 3/06* | (2006.01) | |
| *G11C 16/24* | (2006.01) | |
| *G11C 16/04* | (2006.01) | |

(52) U.S. Cl.
CPC ............ *G11C 16/10* (2013.01); *G06F 3/0604* (2013.01); *G06F 3/0659* (2013.01); *G06F 3/0679* (2013.01); *G11C 16/24* (2013.01); *G11C 16/30* (2013.01); *G11C 16/3459* (2013.01); *G11C 16/0483* (2013.01)

(58) Field of Classification Search
CPC ................................. G11C 16/10; G11C 16/26
USPC ......................................... 365/185.22, 185.24
See application file for complete search history.

(56) References Cited

U.S. PATENT DOCUMENTS

| | | | | |
|---|---|---|---|---|
| 10,283,202 | B1* | 5/2019 | Chen ...................... | G11C 16/08 |
| 10,373,697 | B1* | 8/2019 | Lai ....................... | G11C 16/3445 |
| 2009/0290418 | A1* | 11/2009 | Han ..................... | G11C 11/5628 |
| | | | | 365/185.09 |
| 2013/0286746 | A1* | 10/2013 | Choi ................... | G11C 16/0483 |
| | | | | 365/185.22 |
| 2014/0177332 | A1* | 6/2014 | Yoo ..................... | G11C 16/0483 |
| | | | | 365/185.2 |

(Continued)

FOREIGN PATENT DOCUMENTS

| | | |
|---|---|---|
| KR | 1020120136116 A | 12/2012 |
| KR | 1020150110917 A | 10/2015 |

*Primary Examiner* — Michael T Tran
(74) *Attorney, Agent, or Firm* — William Park & Associates Ltd.

(57) ABSTRACT

The present disclosure relates to a memory device and a memory system including the same. The memory device includes a memory cell storing data, a voltage generation circuit selectively outputting a program voltage and verify voltages in response to an operation control signal, a page buffer including first latches and second latches, and storing first data sensed by a first sensing current in the first latches and second data sensed by a sensing current greater than the first sensing current in the second latches during a verify operation using the verify voltages, and a pass/fail check circuit determining a pass or fail of the verify operation of the memory cell according to the first data and allowable bits.

19 Claims, 10 Drawing Sheets

(56) References Cited

U.S. PATENT DOCUMENTS

| | | | |
|---|---|---|---|
| 2015/0348633 A1* | 12/2015 | Song | G11C 16/12 |
| | | | 365/185.19 |
| 2016/0011806 A1* | 1/2016 | Zaltsman | G06F 11/1441 |
| | | | 711/166 |
| 2016/0216910 A1* | 7/2016 | Phan | G06F 3/0619 |
| 2016/0276926 A1* | 9/2016 | Miller | H02M 3/07 |
| 2018/0190356 A1* | 7/2018 | Lee | G11C 16/102 |
| 2018/0197610 A1* | 7/2018 | Lee | G11C 16/32 |
| 2018/0211715 A1* | 7/2018 | Cho | G11C 11/5628 |
| 2018/0247697 A1* | 8/2018 | Lee | G11C 16/08 |
| 2019/0057751 A1* | 2/2019 | Lee | G11C 16/26 |
| 2019/0286556 A1* | 9/2019 | You | G11C 16/16 |
| 2019/0369903 A1* | 12/2019 | Tsirkin | G06F 3/0673 |
| 2019/0392909 A1* | 12/2019 | Yang | G11C 16/3459 |
| 2020/0050512 A1* | 2/2020 | Basu | G06F 3/0631 |
| 2020/0051649 A1* | 2/2020 | Her | G11C 16/30 |
| 2020/0143886 A1* | 5/2020 | Lee | G11C 16/10 |
| 2020/0218606 A1* | 7/2020 | Ji | G06F 11/1004 |
| 2020/0219575 A1* | 7/2020 | Ha | G11C 17/16 |
| 2020/0226022 A1* | 7/2020 | Ide | G06F 3/0619 |
| 2020/0226072 A1* | 7/2020 | Kang | G06F 12/10 |

* cited by examiner

MEMORY DEVICE, MEMORY SYSTEM INCLUDING THE MEMORY DEVICE

CROSS-REFERENCE TO RELATED APPLICATION

The present application claims priority under 35 U.S.C. § 119(a) to Korean patent application number 10-2018-0133661 filed on Nov. 2, 2018, in the Korean Intellectual Property Office, the entire disclosure of which is incorporated herein by reference.

BACKGROUND

1. Technical Field

Various embodiments generally relate a memory device, a memory system including the same, and programming method for the memory device, and more particularly, to a memory device relating to a program operation and a memory system including the memory device.

2. Related Art

A memory system may include a memory device storing data and a memory controller controlling the memory device in response to a request from a host.

The memory controller may control the memory device to store data, output the stored data, or erase the stored data. A memory device may include a volatile memory device losing the stored data in the absence of power supply or a non-volatile memory device retaining the stored data in the absence of power supply. The memory device may include a memory cell array storing data, peripheral circuits performing various operations including program, read and erase operations, and a control logic controlling the peripheral circuits.

The memory controller may control data communication between the host and the memory device.

SUMMARY

According to an embodiment, one or more memory cells configured to store data; a voltage generation circuit configured to selectively output a program voltage and verify voltages in response to an operation control signal; one or more page buffers including a first latch and a second latch, and configured to store first data sensed by a first sensing current in the first latch and second data sensed by a sensing current greater than the first sensing current in the second latch during a verify operation using one or more verify voltages; and a pass and fail (pass/fail) check circuit configured to determine a pass or fail of the verify operation of the one or more memory cells according to the first data stored in the one or more first latches and one or more allowable bits.

According to an embodiment, a memory device may include a memory cell storing data, a word line coupled to the memory cell, a voltage generation circuit configured to generate a program voltage, a sub-verify voltage, and a main verify voltage greater than the sub-verify voltage applied to the word line, a page buffer coupled to the memory cell through a bit line, and configured to store first data received during a sub-verify operation using the sub-verify voltage in a first latch, store second data received during a main verify operation using the main verify voltage in a second latch, the second data sensed by a first sensing current, and store third data received during the main verify operation using the main verify voltage in a third latch, the third data sensed by a second sensing current greater than the first sensing current, and a pass/fail check circuit configured to determine whether the verify operation of the memory cell passes or fails according to the second data stored in the second latch and an allowable bit.

According to an embodiment, a memory system may include a memory device configured to store data, and a memory controller configured to output a command for controlling a program operation of the memory device according to a request of a host. When the memory device performs the program operation including a verify operation in response to the command, the memory device stores first data according to a first sensing current or a sub-verify voltage in a first latch and second data according to a second sensing current greater than the first sensing current or a main verify voltage greater than the sub-verify voltage in a second latch, and determines a pass or fail of the verify operation according to the first data stored in the first latch and an allowable bit.

DETAILED DESCRIPTION

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

Hereinafter, examples of embodiments of the present disclosure will be described with reference to the accompanying drawings in order for those skilled in the art to be able to readily implement the technical spirit of the present disclosure.

Various embodiments of the present disclosure may provide a memory device capable of quickly terminating a program operation using a small number of program pulses during the program operation and a memory system including the memory device.

Figure 1:
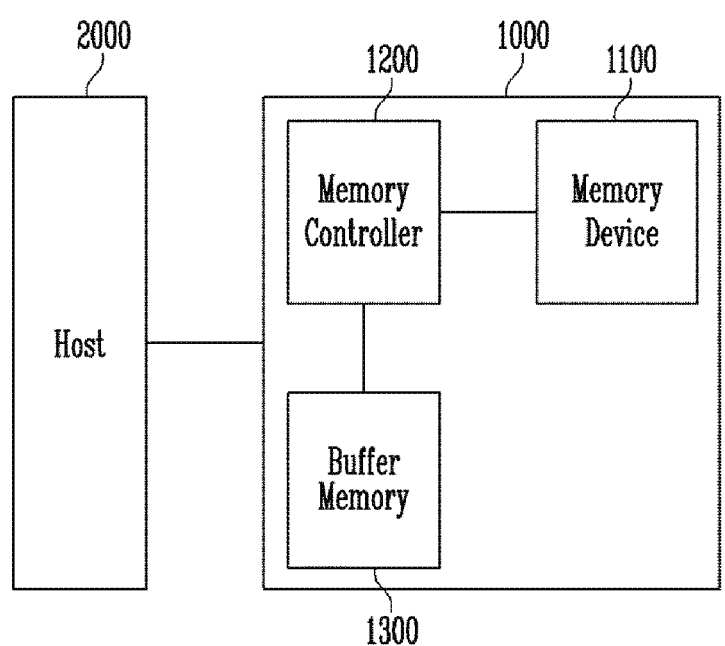
FIG. 1 is a diagram illustrating a memory system.

FIG. 1 is a diagram illustrating a memory system 1000.

Referring to FIG. 1, the memory system 1000 may include a memory device 1100 storing data, a buffer memory 1300 temporarily storing data for operations of the memory system 1000, and a memory controller 1200 controlling the memory device 1100 and the buffer memory 1300 in response to control of the host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), Multi-Media Card (MMC), embedded MMC (eMMC), Dual In-line Memory Module (DIMM), Registered DIMM (RDIMM), and Load Reduced DIMM (LRDIMM) communication methods, etc.

The memory devices 1100 may include a volatile memory device losing the stored data when power supply is blocked, or a non-volatile memory device retaining the stored data even when power supply is blocked. The memory controller 1200 may control the memory device 1100 to perform a program, read, or erase operation. For example, during a program operation, the memory device 1100 may receive a command, an address, and data from the memory controller 1200 and perform the program operation.

The memory controller 1200 may control the general operations of the memory system 1000 and control data exchange between the host 2000 and the memory device 1100. For example, the memory controller 1200 may control the memory device 1100 to program, read or erase data in response to a request from the host 2000. In addition, the memory controller 1200 may receive data and a logical address from the host 2000 and convert the logical address into a physical address indicating a region where the data is actually stored. In addition, the memory controller 1200 may store a logical-to-physical address mapping table configuring a mapping relationship between the logical address and the physical address in the buffer memory 1300.

The buffer memory 1300 may serve as an operation memory or a cache memory of the memory controller 1200 and may store system data used in the memory system 1000 in addition to the above information. According to an embodiment, the buffer memory 1300 may include Double Data Rate Synchronous Dynamic Random Access Memory (DDR SDRAM), DDR4 SDRAM, Low Power Double Data 4 (LPDDR4) SDRAM, Graphics Double Data Rate (GDDR) SDRAM, Low Power DDR (LPDDR), or Rambus Dynamic Random Access Memory (RDRAM), etc.

Figure 2:
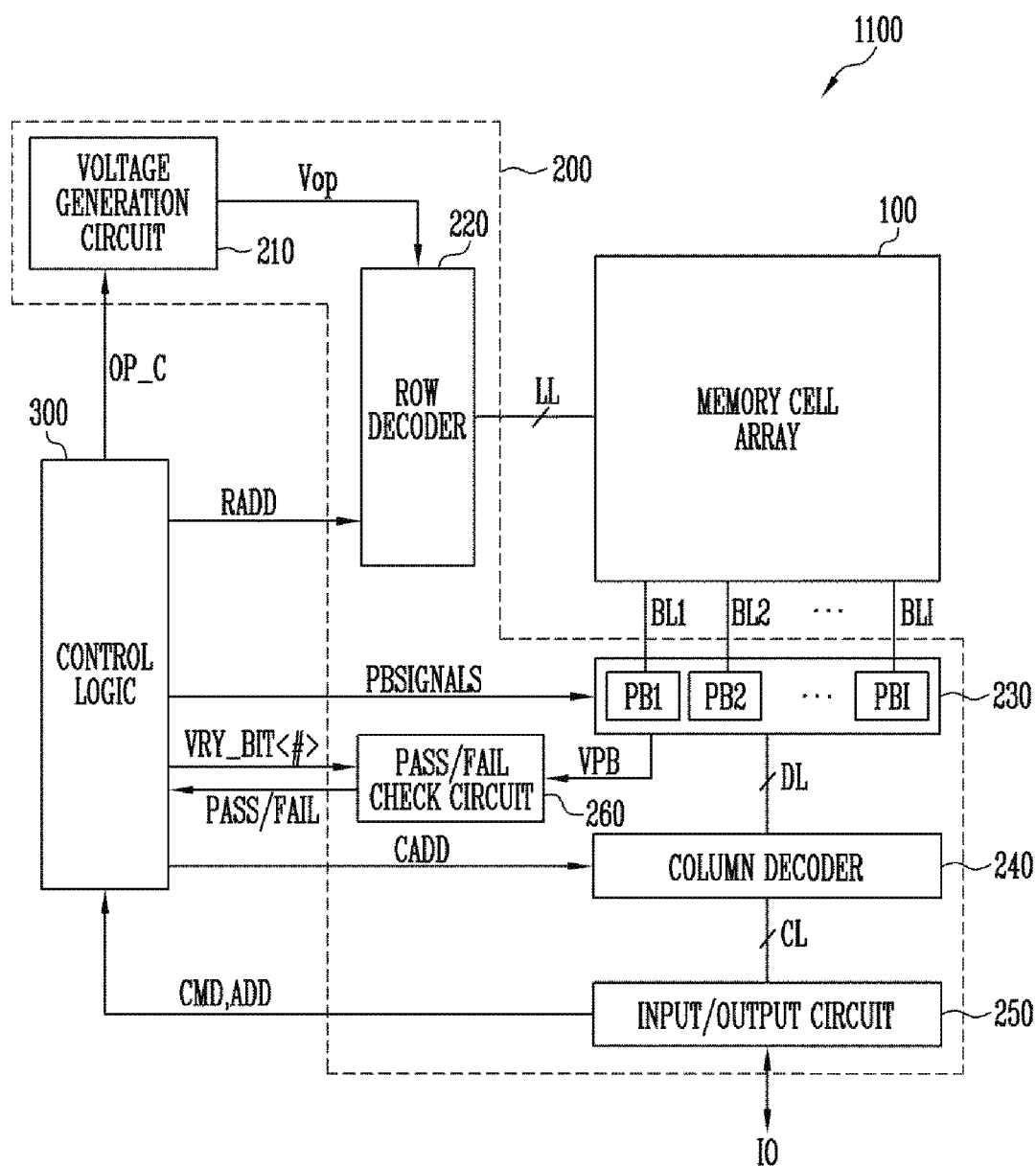
FIG. 2 is a diagram of a memory device of FIG. 1.

FIG. 2 is a diagram of the memory device 1100 of FIG. 1.

The memory device 1100 may be a volatile memory device or a non-volatile memory device. FIG. 2 shows a non-volatile memory device as an embodiment.

The memory device 1100 may include a memory cell array 100 which stores data therein. The memory device 1100 may include peripheral circuits 200 configured to perform a program operation to store data in the memory cell array 100, a read operation to output the stored data, and an erase operation to erase the stored data. The memory device 1100 may include a control logic 300 configured to control the peripheral circuits 200 in response to control of the memory controller 1200 shown in FIG. 2.

The memory cell array 100 may include a plurality of memory blocks (not shown). The memory blocks may store user data and various types of information for performing the operations of the memory device 100. The memory blocks may have a two-dimensional or three-dimensional structure. To improve integration density, three-dimensionally structured memory blocks have been used mainly. Two-dimensional memory blocks may have memory cells arranged in parallel with a substrate, and three-dimensional memory blocks may include memory cells stacked in a vertical direction to the substrate.

The control logic 300 may control the peripheral circuits 200 to perform program, read and erase operations. For example, the peripheral circuits 200 may include a voltage generation circuit 210, a row decoder 220, a page buffer group 230, a column decoder 240, an input/output circuit 250, and a pass/fail check circuit 260.

The voltage generation circuit 210 may generate various operating voltages Vop applied to perform program, read and erase operations in response to an operation control signal OP_C output from the control logic 300. For example, the voltage generation circuit 210 may generate various voltages such as a program voltage, a main verify voltage, a sub-verify voltage, a pass voltage, a read voltage, and an erase voltage in response to control of the control logic 300.

In these embodiments, a program voltage may be applied to a selected word line so as to increase threshold voltages of selected memory cells during a program operation. During a program verify operation, a main verify voltage may be applied to the selected word line to distinguish a cell whose threshold voltage has reached a target voltage from a cell whose threshold voltage has not reached the target voltage. A sub-verify voltage may be applied to the selected word line to determine whether the selected memory cells verify-pass or verify-fail during the program verify operation. The sub-verify voltage may be set to be lower than the main verify voltage.

The row decoder 220 may transfer the operating voltages Vop to local lines LL coupled to a selected memory block, among the memory blocks of the memory cell array 100, in response to a row address RADD. The local lines LL may include local word lines, local drain select lines, and local source select lines. In addition to these lines, the local lines LL may include various other lines coupled to a memory block, such as a source line.

The page buffer group 230 may be coupled to bit lines BL1 to BLI coupled to the memory blocks of the memory cell array 100, where I is a positive integer. The page buffer group 230 may include a plurality of page buffers PB1 to PBI coupled to the bit lines BL1 to BLI, respectively. In an embodiment, the page buffer group 230 may include a plurality of page buffers PB1 to PBI coupled to the bit lines BL1 to BLI in a one-to-one manner whereby a single page buffer is coupled to a single bit line. The page buffers PB1 to PBI may operate in response to page buffer control signals PBSIGNALS. The page puffers PB1 to PBI may temporarily store data read by sensing voltages or currents in the bit lines BL1 to BLI during a program verify operation. The page buffers PB1 to PBI may include a plurality of latches and temporarily store the read data in different latches during different verify operations.

The column decoder 240 may transfer data between the input/output circuit 250 and the page buffer group 230 in response to a column address CADD. For example, the column decoder 240 may exchange data with the page buffers PB1 to PBI through data lines DL, or may exchange data with the input/output circuit 250 through column lines CL.

The input/output circuit 250 may receive a command CMD, an address ADD, and data from the memory controller 1200 shown in FIG. 2 through an input/output lines IO, and may output the read data to the memory controller 1200 through the input/output lines IO. For example, the input/output circuit 250 may transfer the command CMD and the address ADD from the memory controller 1200 to the control logic 300, or may exchange data DATA with the column decoder 240.

The pass/fail check circuit 260 may output a pass signal PASS and a fail signal FAIL by comparing currents from page data VPB and an allowable bit VRY_BIT<#> with each other during a read operation or a program verify operation. During a verify operation, the pass/fail check circuit 260 may determine a pass or fail of the verify operation on the basis of a sensing current or a verify voltage lower than the final sensing current or the final verify voltage, rather than on the basis of data sensed by the final sensing current or the final verify voltage. For example, the pass/fail check circuit 260 may receive the previously sensed data and determine a pass or fail of the verify operation while data is being sensed by the final sensing current or the final verify voltage in the page buffer. Therefore, in these embodiments, a program operation may quickly pass without causing any changes in the pass/fail check circuit 260.

The control logic 300 may control the peripheral circuits 200 in response to the command CMD and the address ADD. For example, the control logic 300 may output the operation control signal OP_C, the page buffer control signals PBSIGNALS, the allowable bit VRY_BIT<#>, the row address RADD, and the column address CADD. During a program verify operation, the control logic 300 may determine a verify pass or a verify fail by using at least one sub-verify voltage lower than the main verify voltage. When as a result of the program verify operation, the verify pass is determined, the control logic 300 may control the peripheral circuits 200 to terminate the program operation without applying the next program voltage to the selected word line. However, when as a result of the program verify operation, the program fail is determined, the control logic 300 may control the peripheral circuits 200 to distinguish cells whose threshold voltages have reached the target voltage from cells whose threshold voltages have not reached the target voltage by using the main verify voltage so that the voltages of the bit lines may be controlled.

Figure 3:
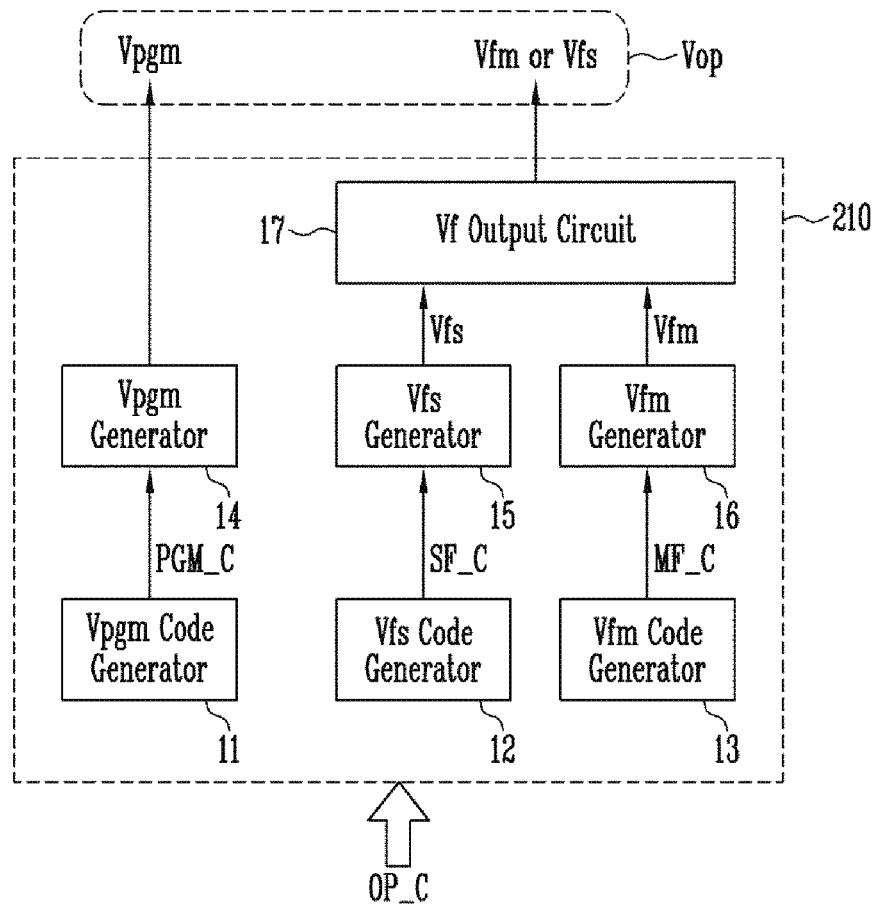
FIG. 3 is a diagram of a voltage generation circuit of FIG. 2.

FIG. 3 is a diagram of the voltage generation circuit 210 of FIG. 2.

Referring to FIG. 3, the voltage generation circuit 210 may output operating voltages (Vpgm, Vfs, and Vfm) in response to the operation control signal OP_C during a program operation. To generate and output a program voltage Vpgm, a sub-verify voltage Vfs, and a main verify voltage Vfm during the program operation, the voltage generation circuit 210 may include a program voltage (Vpgm) code generator 11, a sub-verify voltage (Vfs) code generator 12, a main verify voltage (Vfm) code generator 13, a program voltage (Vpgm) generator 14, a sub-verify voltage (Vfs) generator 15, a main verify voltage (Vfm) generator 16, and a verify voltage (Vf) output circuit 17.

The program voltage code generator 11, the sub-verify voltage code generator 12 and the main verify voltage code generator 13 may output a program voltage code PGM_C, a sub-verify voltage code SF_C and a main verify voltage code MF_C, respectively, in response to the operation control signal OP_C output from the control logic 300. For example, the program voltage code generator 11 may output the program voltage code PGM_C in response to the operation control signal OP_C, the sub-verify voltage code generator 12 may output the sub-verify voltage code SF_C in response to the operation control signal OP_C, and the main verify voltage code generator 13 may output the main verify voltage code MF_C in response to the operation control signal OP_C. For example, each of the program voltage code generator 11, the sub-verify voltage code generator 12 and the main verify voltage code generator 13 may include a plurality of voltage code tables and output a selected code in response to the operation control signal OP_C.

The program voltage generator 14 may generate and output the program voltage Vpgm in response to the program voltage code PGM_C. The sub-verify voltage generator 15 may generate and output the sub-verify voltage Vfs in response to the sub-verify voltage code SF_C. The main verify voltage generator 16 may generate and output the main verify voltage Vfm in response to the main verify voltage code MF_C.

The verify voltage output circuit 17 may receive the sub-verify voltage Vfs and the main verify voltage Vfm and selectively output the sub-verify voltage Vfs or the main verify voltage Vfm. For example, the verify voltage output circuit 17 may not output the sub-verify voltage Vfs and the main verify voltage Vfm until the program voltage generator 14 outputs the program voltage Vpgm. When a program verify operation starts, the verify voltage output circuit 17 may output the sub-verify voltage Vfs first and then the main verify voltage Vfm.

The voltage generation circuit 210 may further include circuits for generating and output other various voltages in addition to the circuits (11 to 17) as shown in FIG. 3.

Figure 4:
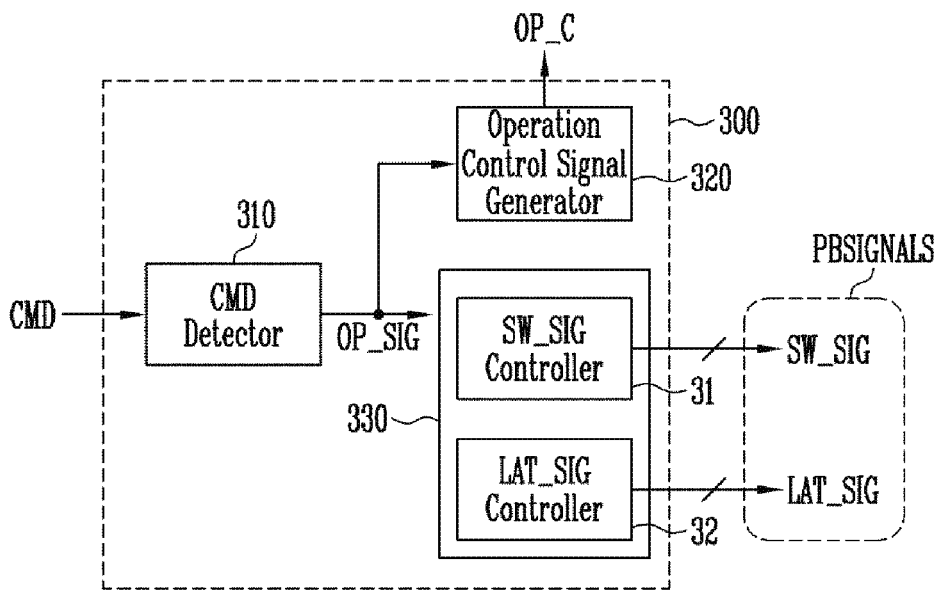
FIG. 4 is a diagram of a control logic of FIG. 2.

FIG. 4 is a diagram of the control logic 300 of FIG. 2.

Referring to FIG. 4, the control logic 300 may output the operation control signal OP_C and the page buffer control signals PBSIGNALS in response to the command CMD. The control logic 300 may include a command (CMD) detector 310, an operation control signal generator 320, and a page buffer controller 330.

The command detector 310 may detect whether the received command CMD is for a program, read, or erase operation, and may output an operation signal OP_SIG corresponding to each command. For example, the command detector 310 may determine whether a verify operation is performed using a sensing current or a sub-verify voltage in response to the command CMD, and may output the operation signal OP_SIG according to the determination.

The operation control signal generator 320 may output the operation control signal OP_C in response to the operation signal OP_SIG. For example, when the operation control signal OP_SIG is for a program operation, the operation control signal generator 320 may output the operation control signal OP_C to generate voltages for the program operation.

The page buffer controller 330 may output the page buffer control signals PBSIGNALS to control the page buffers in response to the operation signal OP_SIG. The page buffer controller 330 may include a switch signal (SW_SIG) controller 31 and a latch signal (LAT_SIG) controller 32.

The switch signal controller 31 may output switch signals SW_SIG for controlling a plurality of switches included in the page buffers, and the latch signal controller 32 may output latch signals LAT_SIG for controlling data transfer of the latches included in the page buffers.

The control logic 300 may include various circuits for controlling the peripheral circuits 200 including a circuit for outputting an address in addition to the circuits shown in FIG. 4.

An embodiment of the page buffers controlled by the switch signals SW_SIG and the latch signals LAT_SIG will be described below.

Figure 5:
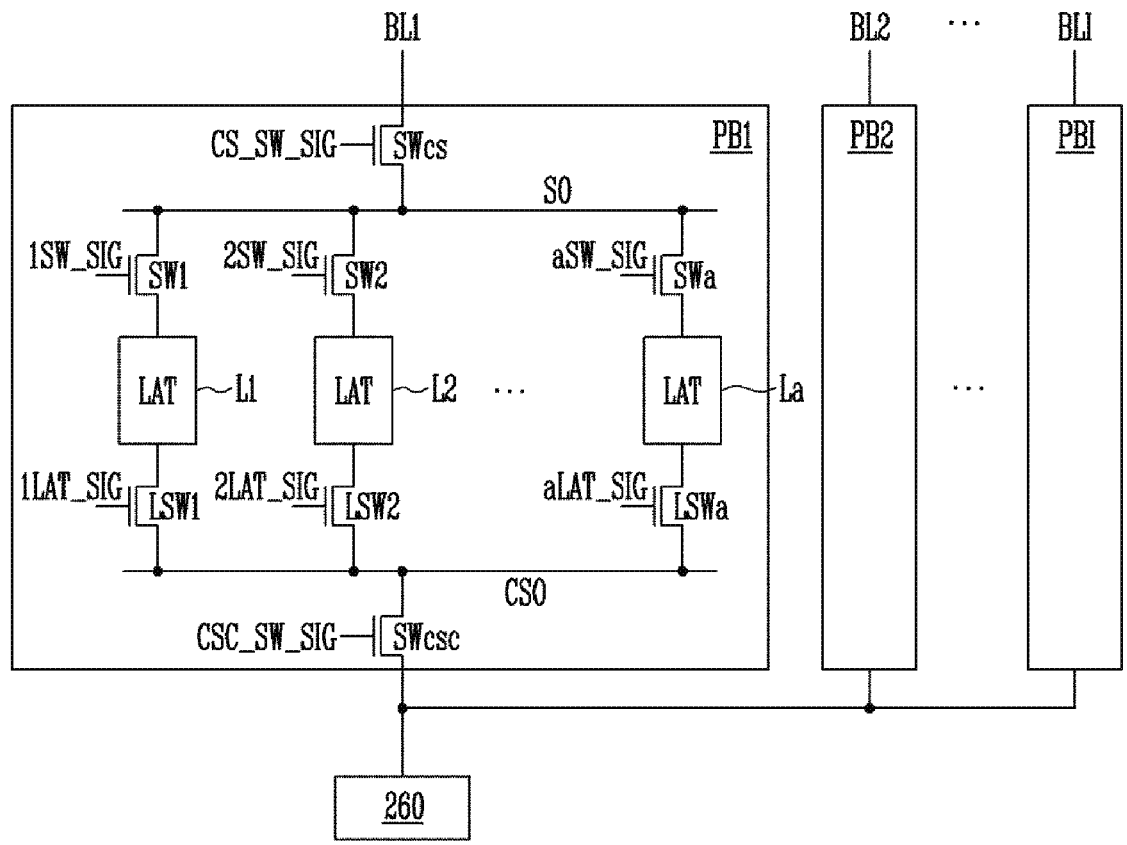
FIG. 5 is a diagram of a page buffer of FIG. 2.

FIG. 5 is a diagram of one of the page buffers of FIG. 2.

Referring to FIG. 5, since the page buffers PB1 to PBI may have the same configuration, the first page buffer PB1 will be described as an example.

The first page buffer PB1 may sense a voltage in the first bit line BL1, temporarily store data, and transfer the temporarily stored data to the pass/fail check circuit 260. For example, the first page buffer PB1 may include a current sensing switch SWcs, first to ath switches SW1 to SWa, first to ath latch switches LSW1 to LSWa, a current sensing check switch SWcsc, and first to ath latches (LAT) L1 to La, where a is a positive integer. In addition, the first page buffer PB1 may further include a plurality of switches including a switch for precharging the first bit line BL1 and a switch for transferring data between the latches.

The current sensing switch SWcs may be composed of an NMOS transistor selectively coupling or blocking the first bit line BL1 to or from a sensing node SO in response to a current sensing switch signal CS_SW_SIG. When the current sensing switch signal CS_SW_SIG having a positive voltage is applied to the current sensing switch SWcs, the current sensing switch SWcs may be turned on, so that the voltage or current of the first bit line BL1 may be transferred to the sensing node SO, or a voltage of the sensing node SO may be transferred to the first bit line BL1. During a read or verify operation, a turn-on level of the current sensing switch SWcs may be controlled by a level of the current sensing switch signal CS_SW_SIG. Thus, the sensing current may be controlled by the level of the current sensing switch signal CS_SW_SIG.

The first to ath latches L1 to La may be coupled in parallel between the sensing node SO and a common sensing node CSO. The first to ath switches SW1 to SWa may be coupled between the sensing node SO and the first to ath latches L1 to La. The first to ath latch switches LSW1 to LSWa may be coupled between the first to ath latches L1 to La and the common sensing node CSO.

The first to ath switches SW1 to SWa may be composed of NMOS transistors which are turned on or off in response to first to ath switch signals 1SW_SIG to aSW_SIG, respectively.

The first to ath latch switches LSW1 to LSWa may be composed of NMOS transistors which are turned on or off in response to first to ath latch signals 1LAT_SIG to aLAT_SIG, respectively.

According to a verify voltage used during a program verify operation, the first to ath switch signals 1SW_SIG to aSW_SIG may be selectively at a high level, and data may be temporarily stored in a selected latch in response to the switch signal which is at the high level.

The current sensing check switch SWcsc may be composed of an NMOS transistor which couples or blocks the common sensing node CSO and the pass/fail check circuit 260 to or from each other in response to a current sensing check switch signal CSC_SW_SIG. For example, when the current sensing check switch SWcsc is turned on, the data stored in the selected latch may be transferred as the page data VPB to the pass/fail check circuit 260.

The current sensing switch signal CS_SW_SIG, the first to ath switch signals 1SW_SIG to aSW_SIG and the current sensing check switch signal CSC_SW_SIG of FIG. 5 may be included in the switch signals SW_SIG of FIG. 4. The first to ath latch signals 1LAT_SIG to aLAT_SIG of FIG. 5 may be included in the latch signals LAT_SIG of FIG. 4.

Figure 6:
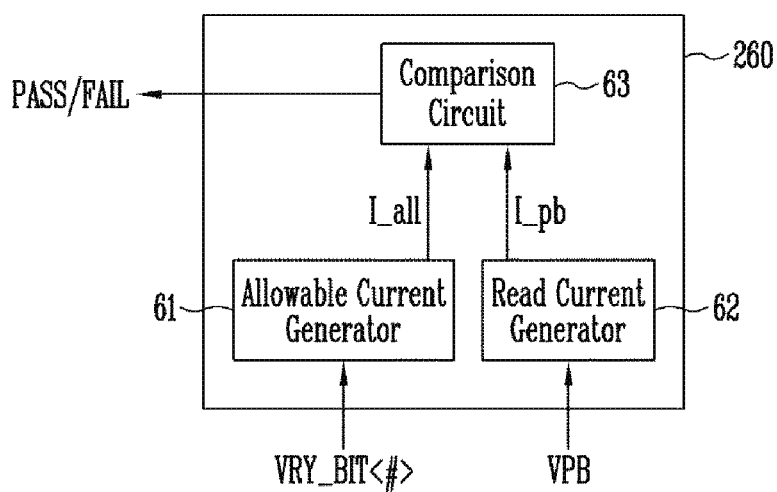
FIG. 6 is a diagram of a pass/fail check circuit of FIG. 2.

FIG. 6 is a diagram of the pass/fail check circuit 260 of FIG. 2.

Referring to FIG. 6, the pass/fail check circuit 260 may generate currents in response to the allowable bit VRY_BIT<#> and the page data VPB, respectively, and compare the generated currents from each other to generate the pass signal PASS or the fail signal FAIL. The pass/fail check circuit 260 may include an allowable current generator 61, a read current generator 62, and a comparison circuit 63.

The allowable current generator 61 may generate an allowable current I_all in response to the allowable bit VRY_BIT<#>. The allowable bit VRY_BIT<#> may be set beforehand and stored in the control logic 300 and may vary depending the memory device 1100. The allowable bit VRY_BIT<#> may be set to '0 or '1'. The amount of the allowable current I_all may increase as the number of allowable bits VRY_BIT<#> increases. Therefore, to change the number of allowable bits VRY_BIT<#>, the number of transistors included in the allowable current generator 61 may change. However, according to an embodiment, pass/fail may be determined based on the data sensed using the sensing current or the verify voltage lower than the final sensing current or the final verify voltage. Therefore, a program operation may pass quickly without increasing the number of transistors included in the allowable current generator 61.

The read current generator 62 may generate a page current I_pb according to the page data VPB. The page data VPB may be received from the page buffers PB1 to PBI during a verify operation and vary depending on a verify voltage and a program loop used in the verify operation. The program loop may refer to an operation in which both a program voltage and a verify voltage are applied to a selected word line. Therefore, a plurality of program loops may be performed while a program operation of a selected page is being performed. The page data VPB may be sensed by a verify voltage or a sensing current lower than the final verify voltage or the final sensing current. Therefore, when a sensing operation is performed using the final verify voltage or the final sensing current, the page data VPB may also be received.

The comparison circuit 63 may compare voltages generated by the allowable current I_all and the page current I_pb and output the pass signal PASS or the fail signal FAIL according to the comparison result. For example, the comparison circuit 63 may output the pass signal PASS when the voltage generated by the allowable current I_all is greater than the voltage generated by the page current I_pb, and otherwise, may output the fail signal FAIL. However, conditions under which the pass signal PASS or the fail signal FAIL is output may vary depending on the comparison circuit 63. Therefore, the comparison circuit 63 may be configured so that the voltage generated by the allowable current I_all is less than the voltage generated by the page current I_pb according to the page data VPB.

Figure 7:
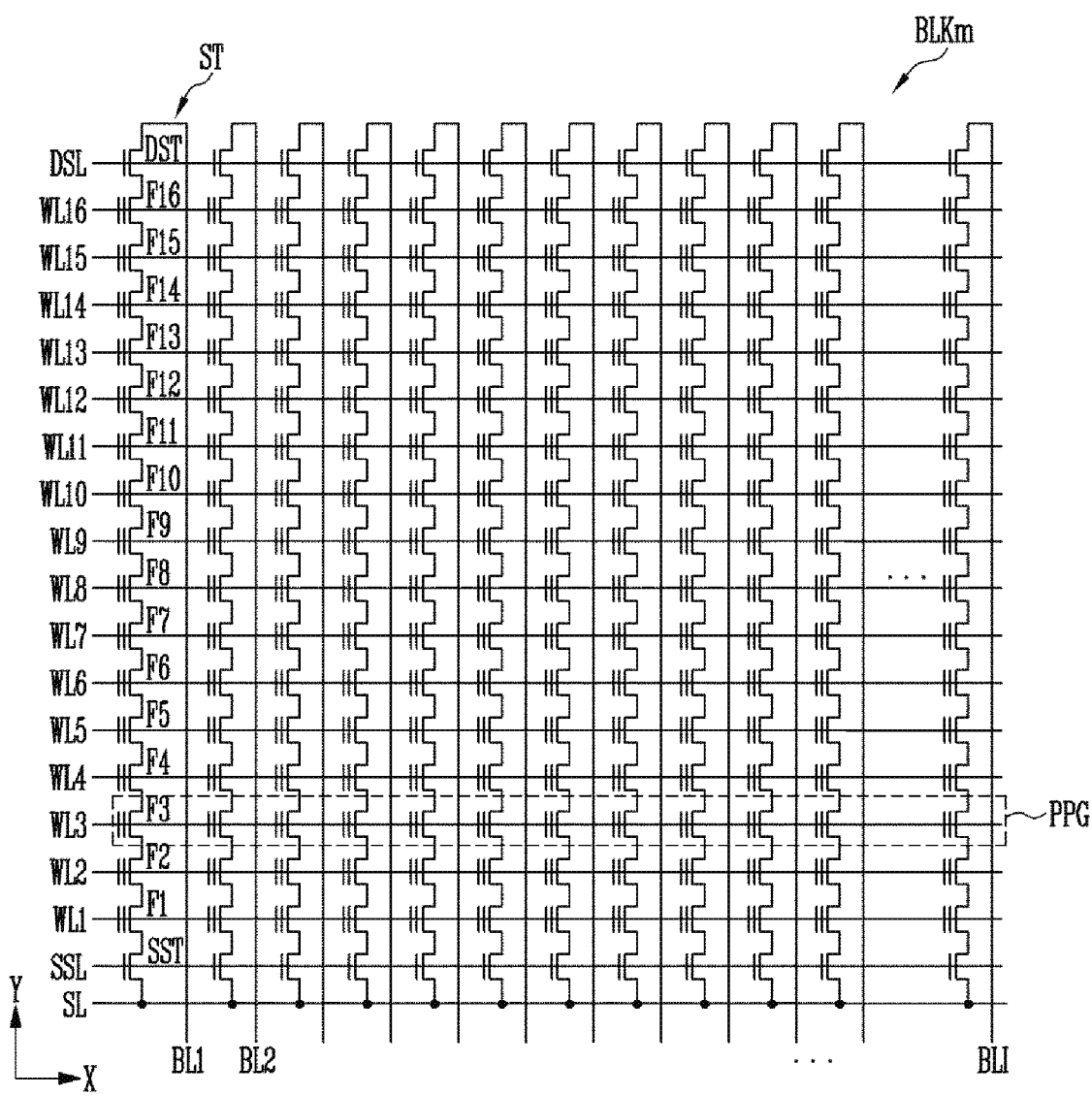
FIG. 7 is a diagram of a memory block included in a memory device.

FIG. 7 is a diagram of a memory block BLKm included in the memory device 1100.

Referring to FIG. 7, the memory block BLKm may be coupled to a plurality of word lines arranged in parallel between a first select line and a second select line. The first select line may be a source select line SSL and the second select line may be a drain select line DSL. For example, the memory block BLKm may include a plurality of strings ST coupled between the bit lines BL1 to BLI and a source line SL. The bit lines BL1 to BLI may be coupled to the strings ST, respectively, and the source line SL may be coupled in common to the strings ST. Since the strings ST may have the same configuration, the string ST coupled to the first bit line BL1 will be described in as an example.

The string ST may include a source select transistor SST, a plurality of memory cells F1 to F16, and a drain select transistor DST coupled in series between the source line SL and the first bit line BL1. Each string ST may include at least one source select transistor SST, at least one drain select transistor DST, and more memory cells than the memory cells F1 to F16 as shown in FIG. 7.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to a plurality of word lines WL1 to WL16. A group of memory cells coupled to the same word line, among memory cells included in different strings ST, may be referred to as a physical page PPG. Therefore, the memory block BLKm may include as many physical pages PPG as the number of word lines WL1 to WL16.

A memory cell in which 1-bit data is stored is referred to as a single-level cell (SLC). In a single level cell, one physical page PPG may store data corresponding to one logical page LPG. Data of the single logical page LPG may include as many data bits as the number of cells included in the single physical page PPG. A memory cell MC in which two or more bits of data are stored is referred to as a multi-level cell (MLC). In a multi-level cell, one physical page PPG may store data corresponding to two or more logical pages LPG.

A plurality of memory cells included in one physical page PPG may be simultaneously programmed. In other words, the memory device 1100 may perform a program operation on each physical page PPG. A plurality of memory cells included in a single memory block may be simultaneously erased. In other words, the memory device 1100 may perform an erase operation in unit of the memory block BLKm. The memory block BLKm may be referred to as an erase unit block. For example, to update a portion of the data stored in one memory block BLKm, the entire data stored in the corresponding memory block BLKm may be read first, the portion of the data which is to be updated may be changed, and the entire data may be then programmed into another memory block BLKm. When the memory block BLKm is the unit used for an erase operation in association with operations of the memory device 1100, it may be impossible to erase only a portion of the data stored in the memory block BLKm and then program the memory block BLKm with new data.

A program operation may be performed in units of pages. For example, the program operation may include an apply step of applying a program voltage to a word line of a selected page and a verify step of sensing threshold voltages of memory cells included in the selected page. Applying a program voltage and verifying threshold voltages of memory cells to which the program voltage is applied may constitute a single program loop. In an incremental step pulse program (ISPP) scheme in which a program voltage increases gradually, the number of program loops may also increase as the program voltage increases.

In an embodiment, a verify operation using at least two verify voltages may be sequentially performed in a single program loop. For example, the verify operation may include a sub-verify operation for determining a pass or fail of the verify operation by using a sub-verify voltage and a main verify operation for determining a voltage applied to bit lines by using a main verify voltage greater than the sub-verify voltage.

Figure 8:
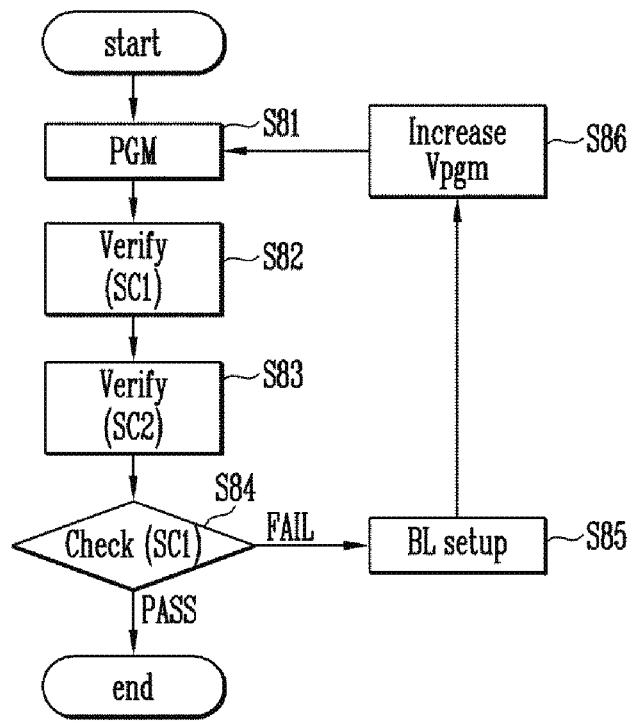
FIG. 8 is a flowchart illustrating an operating method according to an embodiment of the present disclosure.

FIG. 8 is a flowchart illustrating an operating method according to an embodiment of the present disclosure.

Referring to FIG. 8, when a program operation starts, a program voltage applying operation PGM in which the program voltage Vpgm is applied to a selected word line may be performed (S81). The first program voltage Vpgm may be a start program voltage. For example, during the program voltage applying operation PGM, a program permission voltage and a program inhibition voltage may be applied to selected bit lines and unselected bit lines, respectively, and a program voltage may be applied to the selected word line. The selected bit lines may be coupled to program target cells, and the unselected bit lines may be coupled to program non-target cells. The program target cells may be changed into the program non-target cells when threshold voltages thereof increase to a target voltage during the program operation. The program permission voltage may be 0 V and the program inhibition voltage may be a power supply voltage.

After the program voltage Vpgm is applied to the selected word line for a predetermined time, a verify operation may be performed on selected memory cells (S82 and S83). The verify operation (S82 and S83) may be performed using a single verify voltage, for example, the main verify voltage Vfm. The verify operation may be performed by applying the main verify voltage Vfm to the selected word line once. However, a sensing operation may be performed a plurality of times (S82 and S83) by varying a sensing current. For example, at step 'S82', a result of the verify operation using the main verify voltage Vfm may be sensed using a first sensing current SC1. The first sensing current SC1 may be set to be lower than a second sensing current SC2 which is the final current. Result data of the verify operation using the first sensing current SC1 may be temporarily stored in the first latch L1 of FIG. 5.

When the verify operation using the first sensing current SC1 ends, the result of the verify operation using the main verify voltage Vfm may be sensed by the second sensing current SC2 (S83). The second sensing current SC2 may be set to have a greater current amount than the first sensing current SC1. Result data of the verify operation using the second sensing current SC2 may be temporarily stored in a second latch L2 of FIG. 5.

A sensing result using the first sensing current SC1 may be checked (S84). For example, when the first latch switch LSW1 and the current sensing check switch SWcsc are turned on, data stored in the first latch L1 may be transferred as the page data VPB to the pass/fail check circuit 260, and the pass/fail check circuit 260 may check a pass or fail of the verify operation according to the data transferred from the pass/fail check circuit 260. For example, when the check result (S84) indicates PASS, the program operation of the selected page may end. However, when the check result (S84) indicates FAIL, a bit line setup operation may be performed to perform a next program loop (S85). In order to shorten an operation time, steps 'S83' and 'S84' may be performed at the same time.

In a bit line setup operation (S85), voltages of the bit lines may be set up according to the data temporarily stored in latches of page buffers at steps 'S83' and 'S84'. For example, a program permission voltage may be applied to bit lines coupled to memory cells determined as erase cells at step 'S82'. A bit line reference voltage may be applied to bit lines coupled to memory cells which are determined as program cells at step 'S82' and determined as erase cells at step 'S83'. The program inhibition voltage may be applied to bit lines coupled to memory cells determined as program cells at step 'S83'. The program permission voltage may be 0 V or a ground voltage. The program inhibition voltage may be a positive voltage greater than the program permission voltage so as not to increase threshold voltages of the memory cells. The bit line reference voltage may be a positive voltage between the program permission voltage and the program inhibition voltage so that the threshold voltages of the memory cells may be increased slowly.

When the voltages of the bit lines are set up, the program voltage Vpgm may be increased by a step voltage (Increase Vpgm; S86), and steps 'S81' to 'S86' may be repeated until the check operation (S84) using the first sensing current SC1 is determined as PASS.

When different sensing currents are used during a verify operation using one main verify voltage, a page buffer may recognize different cell current amounts. As shown in FIG. 8, the verify operation may be performed using the first sensing current SC1 lower than the second sensing current SC2 which is a target current, and the sensing check operation (S84) may be performed as a result thereof, so that the sensing check operation (S84) may be performed faster than the sensing check operation performed according to a result of the second sensing current SC2. Therefore, the program operation may be terminated quickly, so that a program operation time may be shortened. In addition, the result of the verify operation may be quickly determined as PASS without changing the start program voltage or the number of allowable bits.

FIG. 8 illustrates an embodiment using the first and second sensing currents. However, three or more different sensing currents may be used.

A method of controlling the first and second sensing currents as described above will be described below.

Figure 9:
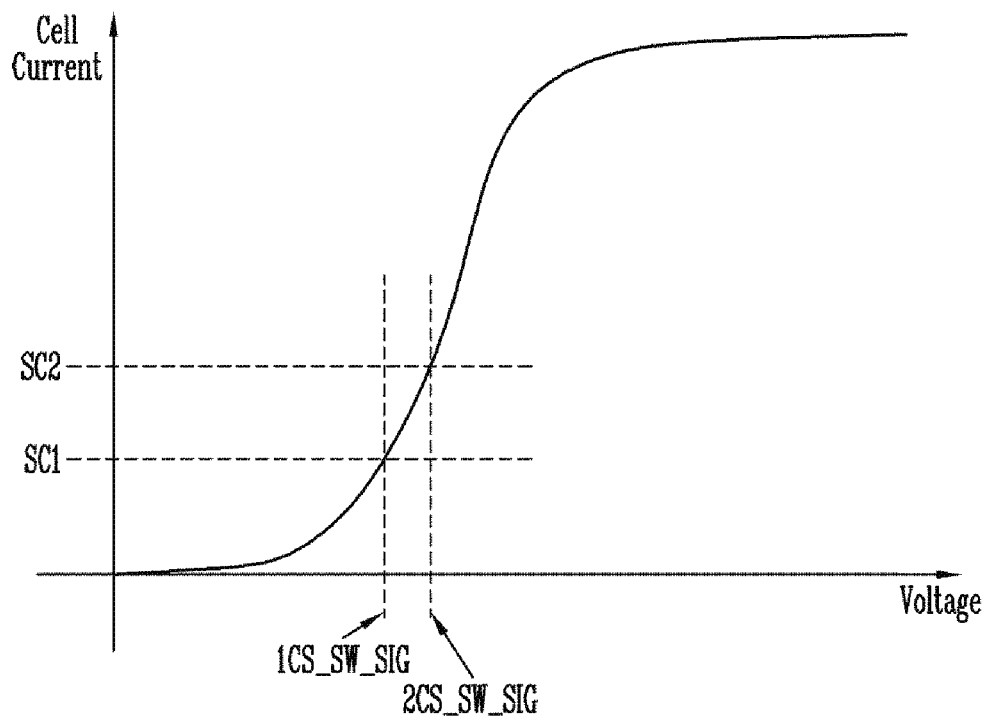
FIG. 9 is a diagram illustrating a control method of a sensing current according to an embodiment of the present disclosure.

FIG. 9 is a diagram illustrating a method of controlling a sensing current according to an embodiment of the present disclosure.

Referring to FIG. 9, a cell current may be measured through a current in bit lines. The current in the bit lines may be varied by controlling a turn-on level of a switch of each of the page buffers. For example, the current sensing switch SWcs of FIG. 5 may be coupled between the first bit line BL1 and the sensing node SO and sense the current of the first bit line BL1 by dividing the current of the first bit line BL1 into the first sensing current SC1 or the second sensing current SC2 depending on the level of the current sensing switch signal CS_SW_SIG.

When the current sensing switch signal CS_SW_SIG is divided to two signals having different levels, one signal having a relatively low level may be a first current sensing switch signal 1CS_SW_SIG and the other signal having a relatively high level may be a second current sensing switch signal 2CS_SW_SIG. When the first current sensing switch signal 1CS_SW_SIG is used, the current amount of the memory cells may be determined according to the first sensing current SC1. When the second current sensing switch signal 2CS_SW_SIG is used, the current amount of the memory cells may be determined according to the second sensing current SC2 greater than the first sensing current SC1. In other words, the level of the main verify voltage Vfm may be decreased by reducing the sensing current. In addition, since the sensing current may be performed earlier by using the first sensing current SC1, rather than the second sensing current SC2, a pass or fail of the verify operation may be quickly determined.

Figure 10:
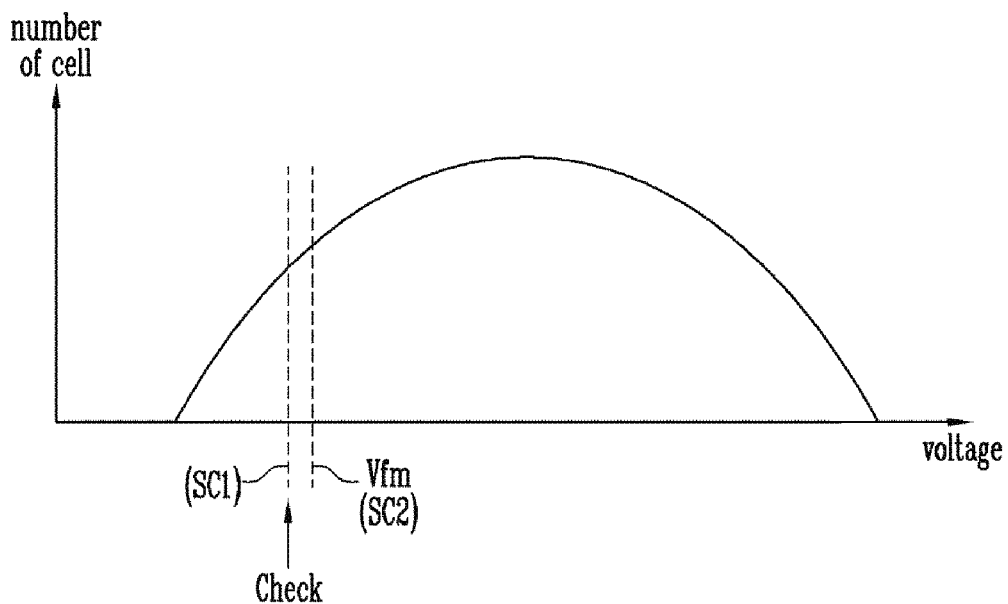
FIG. 10 is a flowchart illustrating a sensing time according to an embodiment of the present disclosure.

FIG. 10 is a flowchart illustrating a sensing time according to an embodiment of the present disclosure.

Referring to FIG. 10, more allowable bits may be generated in a verify operation using the first sensing current SC1 than in a verify result using the second sensing current SC2. For example, in a verify operation using a sensing current, the number of memory cells having threshold voltages greater than the sensing current may be an allowable bit. More allowable bits may be detected in the verify operation using the first sensing current SC1 than in the verify operation using the second sensing current SC2 corresponding to the main verify voltage Vfm. Therefore, by using result data of the verify operation using the first sensing current SC1, whether the program operation passes or fails may be determined based on a verify result value indicating more allowable bits than that in the main verify operation, so that the program operation may pass quickly. Accordingly, a program operation time may be shortened.

Figure 11:
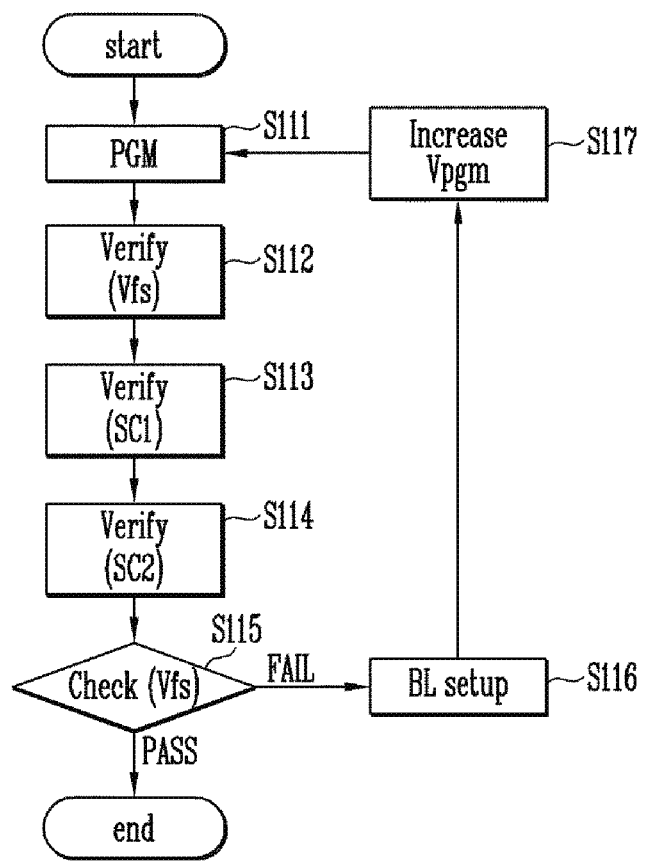
FIG. 11 is a diagram illustrating an operating method according to an embodiment of the present disclosure.

FIG. 11 is a diagram illustrating an operating method according to an embodiment of the present disclosure.

In an embodiment, when varying the sensing current is limited in the above embodiment, a level of a verify voltage applied to a selected word line may be changed instead of changing the sensing current.

Referring to FIG. 11, when a program operation starts, an operation of applying the program voltage Vpgm to a selected word line may be performed (S111). A first program voltage applied to the selected word line may be referred to as a start program voltage. The start program voltage may vary depending on the memory device 1100. The start program voltage may be the lowest program voltage among voltages used in a program operation using an ISPP scheme.

After the program voltage Vpgm is applied to the selected word line, a sub-verify operation (S112) using the sub-verify voltage Vfs may be performed. The sub-verify voltage Vfs may be set to a lower level than the main verify voltage Vfm. Result data of the sub-verify operation (S112) may be temporarily stored in the first latch L1 of the page buffer as shown in FIG. 5.

A main verify operation (S113 and S114) using the main verify voltage Vfm may be performed. The main verify operation (S113 and S114) may be performed using one main verify voltage Vfm. The main verify voltage Vfm may be applied to the selected word line once. A plurality of sensing operations using a plurality of sensing currents may be performed using the main verify voltage Vfm applied once. For example, at step 'S113', a result of the verify operation using the main verify voltage Vfm may be sensed using the first sensing current SC1. The first sensing current SC1 may be set to be lower than the second sensing current SC2 which is the final current. Result data of the verify operation using the first sensing current SC1 may be temporarily stored in the first latch L1 of FIG. 5.

When the verify operation using the first sensing current SC1 ends, the result of the verify operation using the main verify voltage Vfm may be sensed using the second sensing current SC2 (S114). The second sensing current SC2 may be set to have a greater current amount than the first sensing current SC1. Result data of the verify operation using the second sensing current SC2 may be temporarily stored in the second latch L2 of FIG. 5.

A sensing result using the first sensing current SC1 may be checked (S115). For example, when the first latch switch LSW1 and the current sensing check switch SWcsc are turned on, the data stored in the first latch L1 may be transferred as the page data VPB to the pass/fail check circuit 260, and the pass/fail check circuit 260 may check a pass or fail of the verify operation according to the data transferred from the pass/fail check circuit 260. For example, when the check result (S115) indicates PASS, the program operation of the selected page may end. However, when the check result (S115) indicates FAIL, a bit line setup operation may be performed to perform a next program loop (S116). In order to shorten an operation time, steps 'S113', 'S114', and 'S115' may be performed at the same time. For example, after the data sensed at step 'S112' is transferred to the pass/fail check circuit 260, the pass/fail check circuit 260 may determine a pass or fail of the verify operation on the basis of the received data while steps 'S113' and 'S114' are performed.

In the bit line setup operation (S116), voltages of bit lines may be set up according to data temporarily stored in latches of page buffers at steps 'S113' and 'S114'. For example, a program permission voltage may be applied to bit lines coupled to memory cells determined as erase cells at step 'S113'. A bit line reference voltage may be applied to bit lines coupled to memory cells which are determined as program cells at step 'S113' and determined as erase cells at step 'S114'. The program inhibition voltage may be applied to the bit lines coupled to the memory cells determined as the program cells at step '114'. The program permission voltage may be 0 V or a ground voltage. The program inhibition voltage may be a positive voltage greater than the program permission voltage so that threshold voltages of the memory cells may not increase. The bit line reference voltage may be a positive voltage between the program permission voltage and the program inhibition voltage so that the threshold voltages of the memory cells may increase.

After the voltages of the bit lines are set up (S116), the program voltage Vpgm may be increased by a step voltage (Increase Vpgm; S117), and steps 'S111' to 'S117' may be repeated until the check operation (S115) using the sub-verify voltage Vfs may pass.

As shown in FIG. 11, the sensing current may be reduced by performing a sensing check operation on the basis of the verify result using the sub-verify voltage Vfs lower than the main verify voltage Vfm which is the target voltage, so that a time for pass may be determined quickly and the program operation may be terminated quickly. Accordingly, a program operation time may be shortened.

Figure 12:
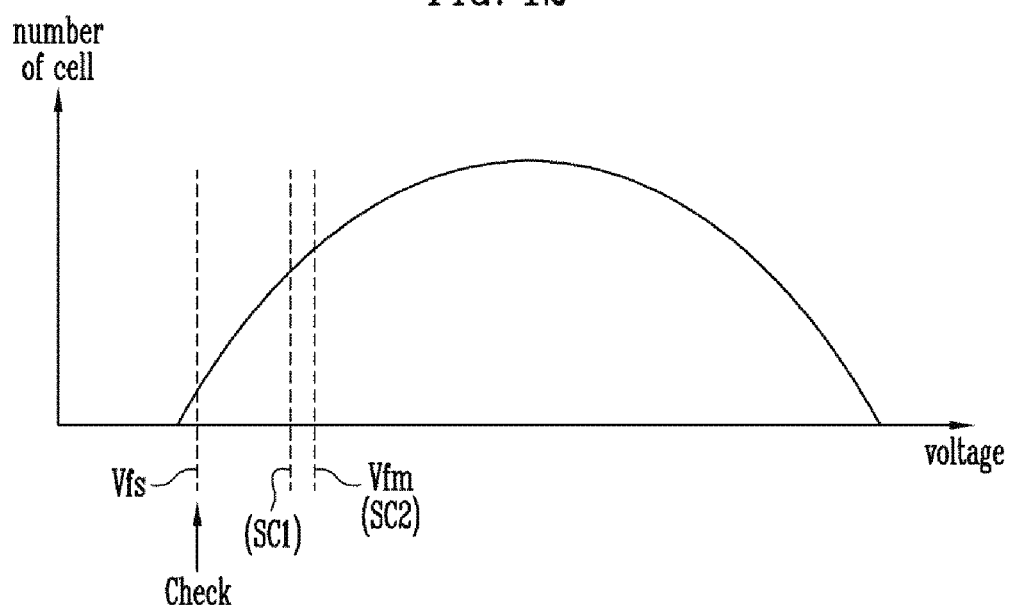
FIG. 12 is a diagram illustrating a sensing time according to an embodiment of the present disclosure.

FIG. 12 is a diagram illustrating a sensing time according to an embodiment of the present disclosure.

Referring to FIG. 12, a sensing check operation may be performed according to a result of the verify operation using the sub-verify voltage Vfs lower than the main verify voltage Vfm. Whether the entire program operation passes or fails may be determined according to a check result of the sub-verify voltage Vfs. When a program loop is iteratively performed, voltages of bit lines may be set up according to a sensing result using the main verify voltage Vfm. In other words, the result of the verify operation may be obtained more quickly than the sensing check operation performed according to the result of the main verify voltage Vfm, so that additionally applying an unnecessary program voltage to the selected word line may be skipped. In addition, since a pass or fail of the verify operation is determined while the data is sensed, an operation time may be shortened. However, the numbers of sub-verify voltages Vfs, main verify voltages Vfm, and sensing currents are not limited to the above-described embodiments.

Figure 13:
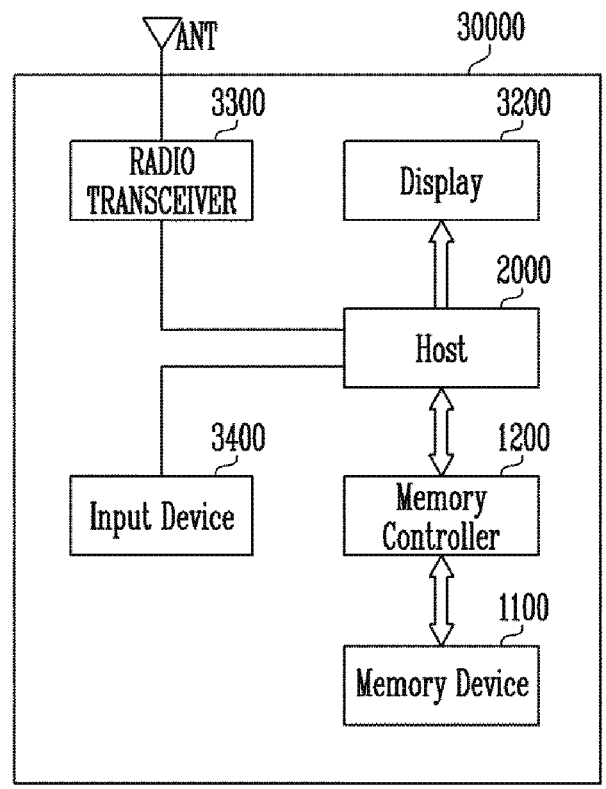
FIG. 13 is a diagram illustrating an embodiment of a memory system including a memory device shown in FIG. 2.

FIG. 13 is a diagram illustrating an embodiment of the memory system 1000 including the memory device 1100 shown in FIG. 2.

Referring to FIG. 13, a memory system 30000 may be embodied into a cellular phone, a smart phone, a tablet PC, a personal digital assistant (PDA), or a wireless communication device.

The memory system 30000 may include the memory device 1100 and the memory controller 1200 controlling the operations of the memory device 1100. The memory controller 1200 may control a data access operation of the memory device 1100, for example, a program operation, an erase operation or a read operation of the memory device 1100 in response to control of the host 2000.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the host 2000. Therefore, the host 2000 may process the signal output from the radio transceiver 3300 and transfer the processed signal to the memory controller 1200 or the display 3200. The memory controller 1200 may transfer the signal processed by the host 2000 into the semiconductor memory device 1100. In addition, the radio transceiver 3300 may change a signal output from the host into a radio signal and output the radio signal to an external device through the antenna ANT. A control signal for controlling the operations of the host 2000 or data to be processed by the host 2000 may be input by an input device 3400, and the input device 3400 may include a pointing device, such as a touch pad and a computer mouse, a keypad, or a keyboard. The host 2000 may control the operations of the display 3200 so that data output from the memory controller 1200, data output from the radio transceiver 3300, or data output from the input device 3400 may be output through the display 3200.

Figure 14:
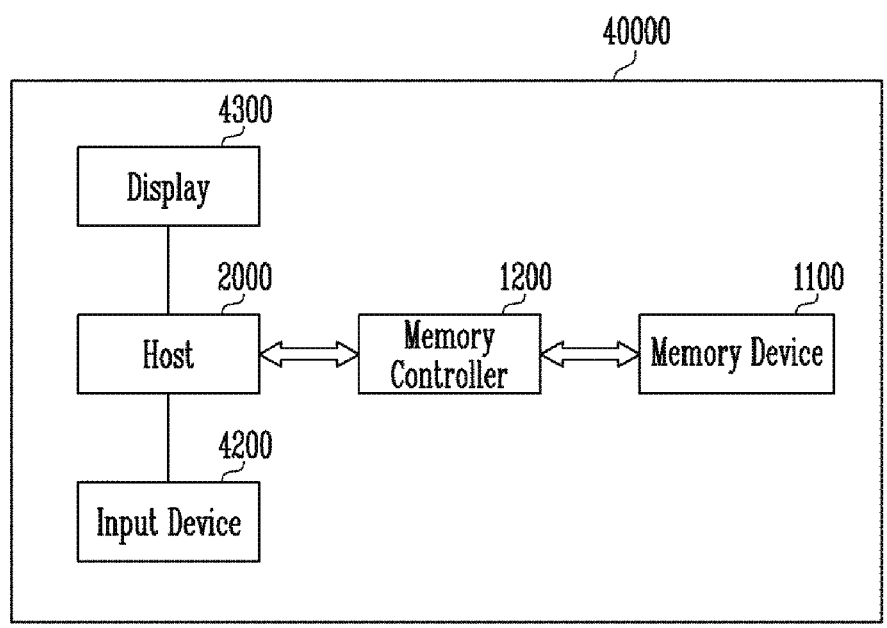
FIG. 14 is a diagram illustrating an embodiment of a memory system including a memory device shown in FIG. 2.

FIG. 14 is a diagram illustrating an embodiment of the memory system 1000 including the memory device 1100 shown in FIG. 2.

Referring to FIG. 14, a memory system 40000 may be embodied into a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

The host 2000 may output data stored in the memory device 1100 through a display 4300 according to data input through an input device 4200. Examples of the input device 4200 may include a pointing device such as a touch pad or a computer mouse, a keypad, or a keyboard.

The host 2000 may control various operations of the memory system 40000 and control operations of the memory controller 1200.

Figure 15:
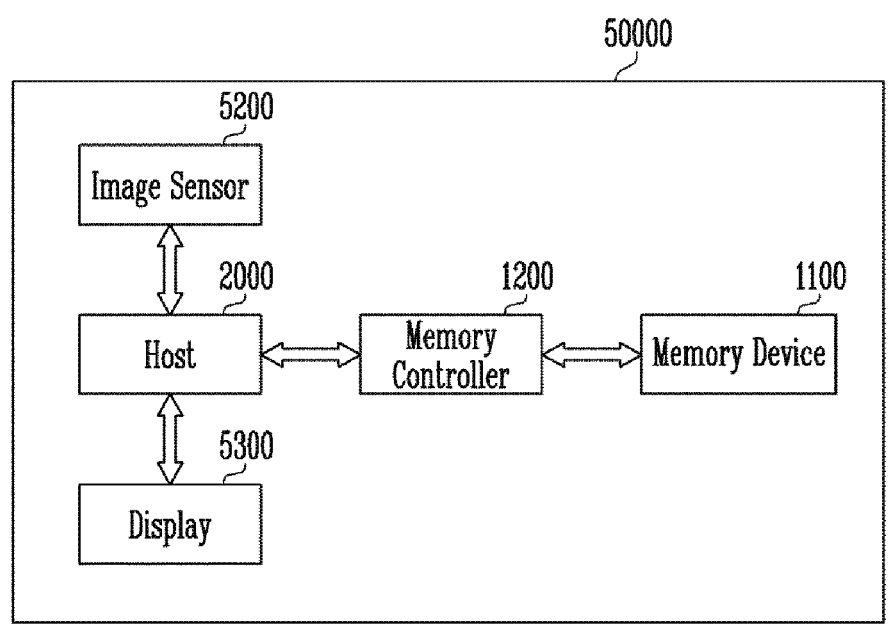
FIG. 15 is a diagram illustrating an embodiment of a memory system including a memory device shown in FIG. 2.

FIG. 15 is a diagram illustrating an embodiment of the memory system 1000 including the memory device 1100 shown in FIG. 2.

Referring to FIG. 15, a memory system 50000 may be embodied into an image processor, for example, a digital camera, a cellular phone with a digital camera attached thereto, a smartphone with a digital camera attached thereto, or a table PC with a digital camera attached thereto.

The memory system 50000 may include the memory device 1100 and the memory controller 1200 controlling a data processing operation of the memory device 1100, for example, a program operation, an erase operation or a read operation.

An image sensor 5200 of the memory system 50000 may convert an optical image into digital signals, and the converted digital signals may be transferred to the host 2000. In response to control of the host, the converted digital signals may be output through a display 5300 or stored in the memory device 1100 through the memory controller 1200. In addition, the data stored in the memory device 1100 may be output through the display 5300 according to control of the host 2000.

Figure 16:
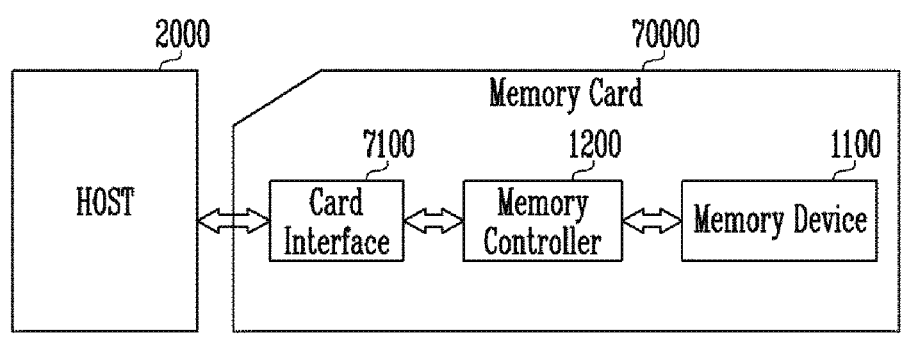
FIG. 16 is a diagram illustrating an embodiment of a memory system including a memory device shown in FIG. 2.

FIG. 16 is a diagram illustrating an embodiment of the memory system 1000 including the memory device 1100 shown in FIG. 2.

Referring to FIG. 16, the memory system 1000 may include the host 2000 and a memory card 70000.

The memory card 70000 may be embodied into a smart card. The memory card 70000 may include the memory device 1100, the memory controller 1200 and a card interface 7100.

The memory controller 1200 may control data exchange between the memory device 1100 and the card interface 7100. According to an embodiment, the card interface 7100 may be, but not limited thereto, a secure digital (SD) card interface or a multi-media card (MMC) interface. In addition, the card interface 7100 may interface data exchange between the host 2000 and the memory controller 1200 according to a protocol of the host 2000. In accordance with an embodiment, the card interface 7100 may support a Universal Serial Bus (USB) protocol and an InterChip (IC)-USB protocol. The card interface 7100 may refer to hardware that supports a protocol used by the host 2000, software mounted on the hardware, or a signal transmission method.

According to the present disclosure, a memory device may quickly determine a time for a program pass by performing an operation of determining whether a program operation passes or fails during a verify operation using a sub-verify voltage lower than a main verify operation, so that a program operation time may be shortened.

While the embodiments of the present disclosure have been disclosed for illustrative purposes, those skilled in the art will appreciate that various modifications, additions and substitutions are possible.

What is claimed is:

1. A memory device, comprising:
one or more memory cells configured to store data;
a voltage generation circuit configured to selectively output a program voltage and verify voltages in response to an operation control signal;
one or more page buffers including a first latch and a second latch, and configured to store first data sensed by a first sensing current in the first latch and second data sensed by a second sensing current greater than the first sensing current in the second latch during a verify operation using one or more verify voltages; and
a pass and fail (pass/fail) check circuit configured to determine a pass or fail of the verify operation of the one or more memory cells according to the first data stored in the one or more first latches and one or more allowable bits,
wherein a number of allowable bits of the second data is a number of memory cells having threshold voltages greater than the second sensing current, and
a number of allowable bits of the first data is a number of memory cells having threshold voltages greater than the first sensing current.

2. The memory device of claim 1, wherein the page buffer comprises:
a current sensing switch selectively blocking a current of a bit line coupled to a memory cell;
a sensing node coupled to the current sensing switch;
the first and second latches coupled in parallel between the sensing node and a common sensing node; and
a current sensing check switch coupled between the common sensing node and the pass/fail check circuit.

3. The memory device of claim 2, wherein the current sensing switch transfers the first data sensed from the memory cell to the sensing node according to the first sensing current in response to a first current sensing switch signal, and transfers the second data sensed from the memory cell to the sensing node according to the second sensing current in response to a second current sensing switch signal.

4. The memory device of claim 3, further comprising switches coupled between the sensing node and the first and second latches and selectively transferring the first or second data transferred to the sensing node to the first or second latches.

5. The memory device of claim 3, further comprising latch switches coupled between the first and second latches and the common sensing node and selectively transferring the first and second data stored in the first and second latches to the common sensing node.

6. The memory device of claim 1, further comprising a control logic controlling the page buffer and the pass/fail check circuit in response to a command received from a memory controller.

7. The memory device of claim 6, wherein the control logic controls a voltage applied to a bit line coupled to the memory cell according to the first and second data stored in the first and second latches when the verify operation fails.

8. A memory device, comprising:
a memory cell configured to store data;
a word line coupled to the memory cell;

a voltage generation circuit configured to generate a program voltage, a sub-verify voltage, and a main verify voltage greater than the sub-verify voltage applied to the word line;

a page buffer coupled to the memory cell through a bit line, and configured to store first data received during a sub-verify operation using the sub-verify voltage in a first latch, store second data received during a main verify operation using the main verify voltage in a second latch, the second data sensed by a first sensing current, and store third data received during the main verify operation using the main verify voltage in a third latch, the third data sensed by a second sensing current greater than the first sensing current; and a pass and fail (pass/fail) check circuit configured to determine whether the verify operation of the memory cell passes or fails according to the second data stored in the second latch and an allowable bit.

9. The memory device of claim 8, wherein the voltage generation circuit comprises:

a program voltage generator generating the program voltage;

a sub-verify voltage generator generating the sub-verify voltage;

a main verify voltage generator generating the main verify voltage; and a verify voltage output circuit selectively outputting the sub-verify or main verify voltage.

10. The memory device of claim 8, wherein the page buffer sets up a voltage of the bit line according to the third data when the verify operation of the memory cell fails.

11. The memory device of claim 8, further comprising a control logic terminating a program operation of the memory cell when the main verify operation using the second data sensed by the first sensing current passes and continues performing the program operation of the memory cell when the main verify operation using the second data sensed by the first sensing current fails.

12. The memory device of claim 11, wherein the control logic comprises:

a command detector outputting an operation signal in response to a command;

an operation control signal generator outputting an operation control signal for controlling the voltage generation circuit in response to the operation signal; and a page buffer controller outputting switch signals and latch signals for controlling the page buffer in response to the operation signal.

13. The memory device of claim 12, wherein the page buffer controller comprises:

a switch signal controller outputting the switch signals in response to the operation signal; and a latch signal controller outputting the latch signals in response to the operation signal.

14. The memory device of claim 13, wherein the switch signal controller controls the switch signals so that first result data of the sub-verify operation is stored in the first latch, second result data of the main verify operation is stored in the second latch, and third result data of the main verify operation is stored in the third latch.

15. The memory device of claim 13, wherein the latch signal controller controls the latch signals to transfer the first, second, or third data stored in the first, second, or third latch, respectively, to the pass/fail check circuit.

16. A memory system, comprising:

a memory device configured to store data; and a memory controller configured to output a command for controlling a program operation of the memory device according to a request of a host, wherein when the memory device performs the program operation including a verify operation in response to the command, the memory device stores first data according to a first sensing current or a sub-verify voltage in a first latch and second data according to a second sensing current greater than the first sensing current or a main verify voltage greater than the sub-verify voltage in a second latch, and determines a pass or fail of the verify operation according to the first data stored in the first latch and an allowable bit.

17. The memory system of claim 16, wherein the memory device comprises:

memory cells storing the data;

page buffers coupled to the memory cells through bit lines and including the first and second latches;

a pass and fail (pass/fail) check circuit determining whether the program operation passes or fails according to the first data stored in the first latch when the second data is stored in the second latch; and a control logic determining whether to use the first sensing current or the sub-verify voltage and controlling the page buffers and the pass/fail check circuit in response to the command.

18. The memory system of claim 17, wherein the control logic comprises:

a command detector determining whether to use the first sensing current or the sub-verify voltage to output an operation signal in response to the command;

an operation control signal generator controlling a voltage generation circuit to use the sub-verify voltage in response to the operation signal; and a page buffer controller controlling the page buffer to use the first sensing current in response to the operation signal.

19. The memory system of claim 17, wherein the control logic terminates the program operation when the verify operation passes, and sets up a bit line voltage for a next program loop according to the first and second data stored in the first and second latches when the verify operation fails.

* * * * *